(12) United States Patent
Orikasa et al.

(10) Patent No.: US 11,466,368 B2
(45) Date of Patent: Oct. 11, 2022

(54) SHEET MATERIAL, METAL MESH AND MANUFACTURING METHODS THEREOF

(71) Applicant: TDK CORPORATION, Tokyo (JP)

(72) Inventors: Makoto Orikasa, Tokyo (JP); Yuhei Horikawa, Tokyo (JP); Yoshihiro Kanbayashi, Tokyo (JP); Hisayuki Abe, Tokyo (JP); Hiroki Ashizawa, Tokyo (JP); Miho Mori, Tokyo (JP); Misaki Tamura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 1112 days.

(21) Appl. No.: 16/046,422

(22) Filed: Jul. 26, 2018

(65) Prior Publication Data
US 2019/0032221 A1    Jan. 31, 2019

(30) Foreign Application Priority Data
Jul. 27, 2017    (JP) .............................. JP2017-145727

(51) Int. Cl.
| C23C 18/16 | (2006.01) |
| C23C 18/31 | (2006.01) |
| H05K 1/03 | (2006.01) |
| H05K 3/06 | (2006.01) |
| H05K 3/18 | (2006.01) |

(Continued)

(52) U.S. Cl.
CPC .............. *C23C 18/31* (2013.01); *B32B 15/00* (2013.01); *C23C 18/1603* (2013.01); *C23C 18/1641* (2013.01); *C23C 18/1651* (2013.01); *C23C 18/1689* (2013.01); *H05K 1/0373* (2013.01); *H05K 3/06* (2013.01); *H05K 3/181* (2013.01); *H05K 999/99* (2013.01); *C23C 18/30* (2013.01); *C23C 18/32* (2013.01); *C23C 18/38* (2013.01); *G06F 2203/04103* (2013.01); *G06F 2203/04112* (2013.01); *H05K 2201/09681* (2013.01); *H05K 2201/10151* (2013.01); *H05K 2203/0307* (2013.01); *H05K 2203/072* (2013.01)

(58) Field of Classification Search
CPC . C23C 18/31; C23C 18/1603; C23C 18/1641; C23C 18/1651; C23C 18/1689; C23C 18/30; C23C 18/32; C23C 18/38; C23C 18/165; B32B 15/00; H05K 1/0373; H05K 3/06; H05K 3/181; H05K 999/99; H05K 2201/09681; H05K 2201/10151; H05K 2203/0307; H05K 2203/072; G06F 2203/04103; G06F 2203/04112
See application file for complete search history.

(56) References Cited

U.S. PATENT DOCUMENTS

2018/0030600 A1* 2/2018 Okada .................... H05K 3/422

FOREIGN PATENT DOCUMENTS

| CN | 101578392 A | 11/2009 |
| CN | 101578392 B * | 4/2011 ........... A61K 9/2846 |

(Continued)

*Primary Examiner* — Daniel J. Schleis
*Assistant Examiner* — Kevin CT Li
(74) *Attorney, Agent, or Firm* — Oliff PLC

(57) ABSTRACT

A sheet material includes a resin layer containing a binder and polypyrrole particles, an electroless plating film provided on the side of one main surface of the resin layer and including first electroless plating films and a second electroless plating film, and a transparent base material provided on the side of the other main surface of the resin layer.

15 Claims, 4 Drawing Sheets

(51) Int. Cl.
*B32B 15/00* (2006.01)
*C23C 18/38* (2006.01)
*C23C 18/30* (2006.01)
*C23C 18/32* (2006.01)

(56) References Cited

FOREIGN PATENT DOCUMENTS

| | | | |
|---|---|---|---|
| JP | 2008-190026 A | | 8/2008 |
| JP | 2013-010884 A | | 1/2013 |
| JP | 2014-150118 A | | 8/2014 |
| JP | 2014150118 A | * | 8/2014 |
| JP | 2015-229260 A | | 12/2015 |
| JP | 2016-074582 A | | 5/2016 |
| JP | 2016-221971 A | | 12/2016 |

* cited by examiner

SHEET MATERIAL, METAL MESH AND MANUFACTURING METHODS THEREOF

TECHNICAL FIELD

The present invention relates to a sheet material, a metal mesh and manufacturing methods therefor.

BACKGROUND

In recent years, an attempt to develop a metal mesh obtained by patterning a fine wiring of a metal such as copper or silver into a mesh shape as an electrode member used for an electronic component such as a touch panel has been made.

The metal mesh is more excellent in that reduction in cost and reduction in resistance can be implemented than when a conventional transparent conductive film such as an ITO (indium tin oxide) film is used. However, when the metal mesh is used as the electrode member used for the touch panel or the like, invisibility of the metal mesh becomes more problematic than that of the ITO film.

As the metal mesh the invisibility of which has been improved, a metal mesh consisting of a copper layer and a blackening metal layer has been known. For example, PTL 1 and PTL 2 disclose a metal mesh using a metal oxide or the like lower in corrosion speed than copper and a metal mesh using a zinc layer, for example, as the blackening metal layer.

PTL 3 describes a film-bearing glass plate in which a stacked film obtained by stacking a plurality of films is formed on a glass plate and the stacked film includes an inorganic film containing at least a noble metal formed on the glass plate and a plating metal film formed on the inorganic film. According to PTL 3, the stacked film is black when viewed from the side of the glass plate.

CITATION LIST

Patent Literature

[PTL 1] Japanese Unexamined Patent Publication No. 2014-150118
[PTL 2] Japanese Unexamined Patent Publication No. 2015-229260
[PTL 3] Japanese Unexamined Patent Publication No. 2016-74582

SUMMARY

In the metal mesh described in each of PTL 1 and PTL 2, a black surface can be formed by providing a blackening metal layer. Accordingly, invisibility of the metal mesh can be improved to some extent. However, examination made by the inventors has indicated that there is still room for improvement in even the metal mesh from the viewpoint of a high reflectance.

In the film-bearing glass plate described in PTL 3, an adhesive property between the glass plate and the stacked film has been difficult to enhance.

The present invention has been made in view of the above-described circumstances and is directed to suppressing a reflectance while improving an adhesive property between a base material and a plating film with respect to a metal mesh formed of the plating film provided on the base material, a sheet material for manufacturing the metal mesh.

The present invention provides a sheet material comprising a resin layer containing a binder and a plurality of polypyrrole particles, an electroless plating film provided on the side of one main surface of the resin layer and including first electroless plating films and a second electroless plating film, and a transparent base material provided on the side of the other main surface of the resin layer. At least some of the plurality of polypyrrole particles respectively have exposure surfaces exposed from the one main surface of the resin layer, and the plurality of exposure surfaces are scattered on the one main surface of the resin layer. The first electroless plating films are provided on the one main surface of the resin layer to respectively surround the plurality of exposure surfaces of the polypyrrole particles. The second electroless plating film is provided to cover the first electroless plating films, and a main surface, on the side of the first electroless plating films, of the second electroless plating film forms concave portions, respectively, along surfaces of the first electroless plating films.

In the sheet material according to the present invention, a reflectance can be suppressed while an adhesive property between the transparent base material and the plating film can be enhanced.

When the one main surface of the resin layer is viewed in a planar view from the side of the electroless plating film, an average value of respective longest diameter of the first electroless plating films may be 18 to 90 nm, and an area ratio of the first electroless plating films to the one main surface may be 80 to 99%.

A main surface, on the opposite side to the first electroless plating films, of the second electroless plating film may be a rough surface.

The present invention also provides a method for manufacturing the above-described sheet material according to the present invention. The method for manufacturing a sheet material according to the present invention comprises a step of forming a resin layer containing a binder and a plurality of polypyrrole particles on a transparent base material, at least some of the plurality of polypyrrole particles respectively having exposure surfaces exposed from one main surface of the resin layer, the plurality of exposure surfaces being scattered on the one main surface of the resin layer, and the transparent base material being provided on the side of the other main surface of the resin layer, a step of making a solution containing a catalyst contact the exposure surfaces of the polypyrrole particles, to form catalyst nuclei respectively adhering to the plurality of exposure surfaces, a step of forming first electroless plating films on the one main surface of the resin layer to respectively surround the plurality of exposure surfaces and the catalyst nuclei, and a step of forming a second electroless plating film to cover the first electroless plating films, a main surface, on the side of the first electroless plating films, of the second electroless plating film forming concave portions, respectively, along surfaces of the first electroless plating films.

The present invention further provides a method for manufacturing a metal mesh, comprising a step of performing etching for the electroless plating film in the above-described sheet material according to the present invention to form an electroless plating film having a mesh-shaped pattern.

As an aspect of a metal mesh, the present invention provides a metal mesh (which may be hereinafter referred to as a "first metal mesh" for convenience) comprising a resin layer containing a binder and a plurality of polypyrrole particles, an electroless plating film provided to form a mesh-shaped pattern on the side of one main surface of the resin layer and including first electroless plating films and a second electroless plating film, and a transparent base material provided on the side of the other main surface of the resin layer. In the first metal mesh, at least some of the plurality of polypyrrole particles respectively have exposure surfaces exposed from the one main surface of the resin layer, and the plurality of exposure surfaces are scattered on the one main surface of the resin layer. The first electroless plating films are provided on the one main surface of the resin layer to respectively surround the plurality of exposure surfaces of the polypyrrole particles. The second electroless plating film is provided to cover the first electroless plating films, and a main surface, on the side of the first electroless plating films, of the second electroless plating film forms concave portions, respectively, along surfaces of the first electroless plating films.

As another aspect of a metal mesh, the present invention provides a metal mesh (which may be hereinafter referred to as a "second metal mesh" for convenience) comprising a transparent base material, a resin layer provided to form a mesh-shaped pattern on the transparent base material and containing a binder and a plurality of polypyrrole particles, and an electroless plating film provided on the transparent base material along the mesh-shaped pattern of the resin layer while covering the resin layer and including first electroless plating films and a second electroless plating film. In the second metal mesh, at least some of the plurality of polypyrrole particles respectively have exposure surfaces exposed from a surface of the resin layer, and the plurality of exposure surfaces are scattered on the surface of the resin layer. The first electroless plating films are provided on the surface of the resin layer to respectively surround the plurality of exposure surfaces of the polypyrrole particles. The second electroless plating film is provided to cover the first electroless plating films, and a surface, on the side of the first electroless plating films, of the second electroless plating film forms concave portions, respectively, along surfaces of the first electroless plating films.

In the above-described metal mesh according to the present invention, a reflectance can be suppressed while an adhesive property between the transparent base material and the plating film can be enhanced.

In the above-described metal mesh, a surface, on the opposite side to the first electroless plating films, of the second electroless plating film may be a rough surface.

According to the present invention, there can be provided a sheet material in which a reflectance can be suppressed while an adhesive property between a base material and a plating film is high and a manufacturing method therefor. According to the present invention, there can be provided a metal mesh having a similar effect to that of the above-described sheet material, and a method for manufacturing thereof.

DETAILED DESCRIPTION

Preferred embodiments of the present invention will be described in detail below with reference to the drawings.

[Sheet Material]

Figure 1:
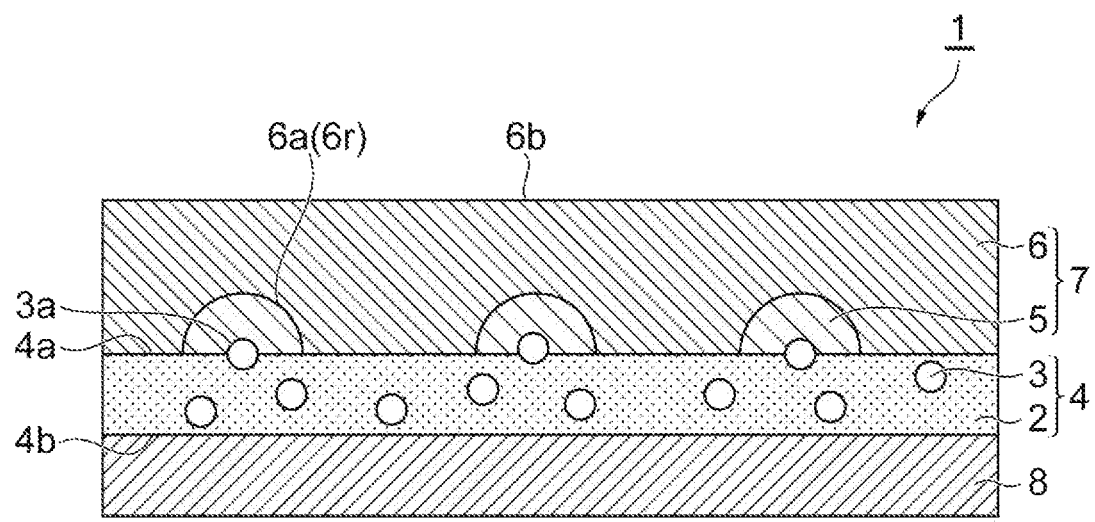
FIG. 1 is a schematic sectional view illustrating an embodiment of a sheet material.

FIG. 1 is a schematic sectional view illustrating an embodiment of a sheet material. As illustrated in FIG. 1, a sheet material 1 according to the present embodiment includes a resin layer 4 containing a binder 2 and a plurality of polypyrrole particles 3, an electroless plating film 7 provided on the side of one main surface 4a of the resin layer 4 and including first electroless plating films 5 and a second electroless plating film 6, and a transparent base material 8 provided on the side of the other main surface 4b of the resin layer 4. Some of the plurality of polypyrrole particles 3 respectively have exposure surfaces 3a exposed from the one main surface 4a of the resin layer 4, and the plurality of exposure surfaces 3a are scattered on the one main surface 4a of the resin layer 4. The first electroless plating films 5 are provided on the one main surface 4a of the resin layer 4 to respectively surround the plurality of exposure surfaces 3a of the plurality of polypyrrole particles 3, the second electroless plating film 6 is provided to cover the first electroless plating films 5, and a main surface 6a, on the side of the first electroless plating films 5, of the second electroless plating film 6 forms concave portions 6r, respectively, along surfaces of the first electroless plating films 5.

The above-described sheet material 1 enables a reflectance to be suppressed while enabling an adhesive property between the base material and the plating film to be enhanced when used to manufacture a metal mesh. The inventors presume the reason why such an effect is obtained, as follows.

First, it is considered that the reason why a reflectance cannot be kept low in a conventional metal mesh provided with a blackening metal layer is that the blackening metal layer uniformly exists, i.e., a large part of the blackening metal layer has a smooth surface. On the other hand, in the sheet material 1 according to the present invention, the first electroless plating films 5 are provided on the one main surface 4a of the resin layer 4 to respectively surround the exposure surfaces 3a of the plurality of polypyrrole particles 3. Accordingly, there are few regions each having a smooth surface, whereby it is presumed that a reflectance can be kept low. In addition, the electroless plating film 7 and the transparent base material 8 are stacked with the resin layer 4 interposed therebetween, whereby it is considered that an adhesive property between the electroless plating film 7 and the transparent base material 8 can be enhanced.

Although the binder 2 is not particularly limited, examples of the binder 2 include polyvinyl chloride-based resin, polycarbonate-based resin, polystyrene-based resin, polymethyl methacrylate-based resin, polyester-based resin, polysulfone-based resin, polyphenylene oxide-based resin, polybutadiene-based resin, poly (N-vinylcarbazole)-based resin, hydrocarbon-based resin, ketone-based resin, phenoxy-based resin, polyamide-based resin, ethylcellulose-based resin, vinyl acetate-based resin, ABS (acrylonitrile-butadiene-styrene)-based resin, urethane-based resin, melamine-based resin, acrylate-based resin, unsaturated polyester-based resin, alkyd-based resin, epoxy-based resin, and silicon-based resin. It is preferable for the binder 2 to contain melamine-based resin from the viewpoint of further improving a plating deposition property and an adhesive property while ensuring transparency of the resin layer 4.

It is preferable for the polypyrrole particles 3 to have an average particle diameter of 10 to 100 nm, and it is more preferable for the polypyrrole particles 3 to have an average particle diameter of 20 to 50 nm. If the average particle diameter of the polypyrrole particles 3 is in the above-described numerical range, the reflectance can be more effectively suppressed when the sheet material and the metal mesh are produced. The average particle diameter is measured by a laser diffraction scattering method, and can be calculated as a value corresponding to a particle diameter at a cumulative volume of 50% when a cumulative volume particle size distribution curve is drawn from the side of a small particle diameter.

Although a mass ratio of the binder 2 and the polypyrrole particles 3 in the resin layer 4 is not particularly limited, it is preferable that a mass ratio of the binder to the polypyrole particles be 2:1 to 15:1, for example, from the viewpoint of efficiently forming the electroless plating film and from the viewpoint of more effectively suppressing the reflectance. Although the thickness of the resin layer 4 is not particularly limited, it is preferable that the thickness be 10 to 100 nm and it is more preferable that the thickness be 50 to 80 nm, for example, from the viewpoint of ensuring transparency of the resin layer while more effectively suppressing the reflectance.

It is preferable for the first electroless plating film 5 to contain at least one type of metal selected from a group consisting of nickel, palladium, gold, silver, and their compounds from the viewpoint of effectively suppressing the reflectance to more exhibit invisibility and from the viewpoint of ensuring a favorable etching property (preventing disconnection by excessive etching) when the electroless plating film 7 is patterned by etching. It is more preferable for the first electroless plating film 5 to further contain phosphorous from the viewpoint of more effectively ensuring the above-described etching property. The content of phosphorous in this case may be 8% by mass or less of the total mass of the first electroless plating films 5.

It is preferable that an average value of the respective longest diameters of the first electroless plating films 5 be 18 to 90 nm when the one main surface 4a of the resin layer 4 is viewed in a planar view from the side of the electroless plating film 7. If the average value of the respective longest diameters of the first electroless plating films 5 is 18 nm or more, the reflectance can be more effectively suppressed by the first electroless plating films 5. If the average value is 90 nm or less, regions each having a smooth surface in the first electroless plating films 5 can be fewer, and as a result the reflectance can be more effectively suppressed.

It is preferable that the area ratio of the first electroless plating films 5 to the one main surface 4a of the resin layer 4 be 80 to 99% when the one main surface 4a of the resin layer 4 is viewed in a planar view from the side of the electroless plating film 7. If the area ratio is 80% or more, the reflectance can be more effectively suppressed by the first electroless plating films 5. If the area ratio is 99% or less, regions each having a smooth surface in the first electroless plating films 5 can be fewer, and as a result the reflectance can be more effectively suppressed.

The average value of the respective longest diameters of the first electroless plating films 5 and the area ratio of the first electroless plating films 5 to the one main surface 4a of the resin layer 4 can be measured by image analysis of an SEM (scanning electron microscope) picture. More specifically, the average value of the respective longest diameters of the first electroless plating films 5 can be calculated by observing the sheet material 1 at a magnification of 200000 times from the side of the electroless plating film 7, acquiring an image of the SEM picture in a field of view which is 500 μm in length and 600 μm in width, actually measuring the respective longest diameters of the first electroless plating films 5 in the field of view, and averaging respective actual measurement values. The area ratio can be found by measuring the respective areas of the first electroless plating films 5 from the respective longest diameters and shortest diameters of the first electroless plating films 5 within the field of view and calculating a ratio of a total value of the areas to the area of the field of view.

It is preferable for the second electroless plating film 6 to contain at least one type of metal selected from a group consisting of copper, nickel, silver, and their compounds and it is more preferable for the second electroless plating film 6 to contain copper from the viewpoint of reducing an electrical resistance. Although the first electroless plating films 5 and the second electroless plating film 6, described above, may contain metals or metal compounds of the same type or different types, it is preferable for the first electroless plating films 5 and the second electroless plating film 6 to respectively contain metals or metal compounds of different types and it is more preferable for the first electroless plating films 5 to contain nickel or a nickel compound and the second electroless plating film 6 contains copper.

Although the thickness of the second electroless plating film 6 is not particularly limited, it is preferable that the thickness be 0.3 to 10 μm and it is more preferable that the thickness be 0.5 to 10 μm, for example, from the viewpoint of more effectively suppressing the reflectance. Particularly, if the thickness of the second electroless plating film 6 is 0.3 μm or more, continuity of the second electroless plating film 6 can be more effectively maintained.

Although not particularly limited, the transparent base material 8 preferably contains at least one type of metal selected from a group consisting of polyethylene terephthalate (PET), polyethylene naphthalate, and polyimide from the viewpoint of easily obtaining a sheet material having a high transmittance and having a low reflectance. Although the thickness of the transparent base material 8 is not particularly limited, it is preferable that the thickness be 3 to 50 μm, for example, from the viewpoint of more effectively suppressing the reflectance.

The sheet material according to the present embodiment may include catalyst nuclei (not illustrated), respectively, between the exposure surfaces 3a of the plurality of polypyrrole particles 3 and the first electroless plating films 5, for example. When the catalyst nuclei are provided, respective adhesive properties between the polypyrrole particles 3 and the first electroless plating films 5 can be further improved while the respective longest diameters of the first electroless plating films 5 and the area ratio of the first electroless plating films 5 to the one main surface 4a of the resin layer 4, described above, can be respectively more efficiently adjusted to desired values. As the catalyst nuclei, at least one type of metal selected from a group consisting of palladium, silver, platinum, gold, nickel, copper, and their compounds may be used. Although the amount and the size of each of the catalyst nuclei are not particularly limited, the amount of the catalyst nucleus may be set to 0.1 to 1.8 μg/cm², and the size of the catalyst nucleus may be set to 3 to 120 nm.

Figure 2:
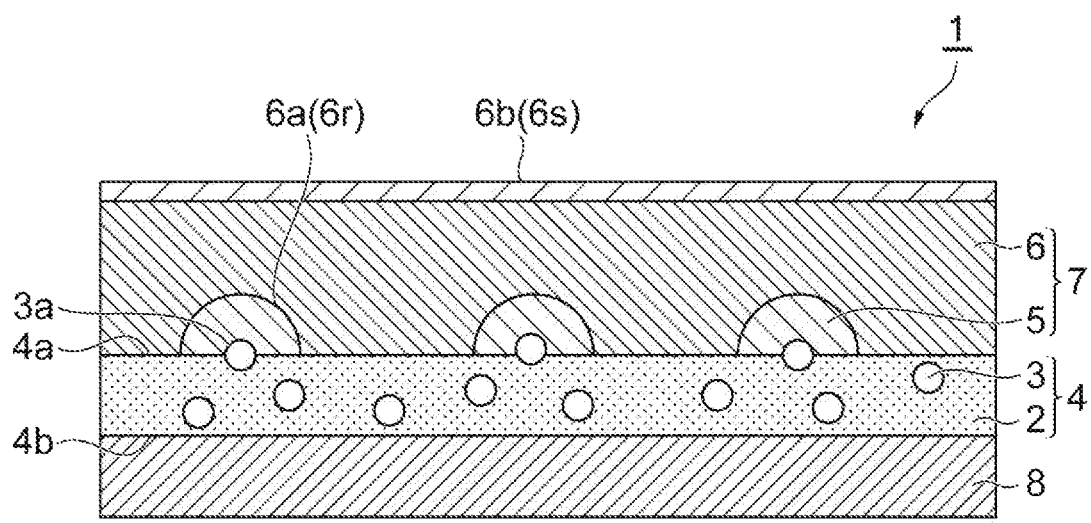
FIG. 2 is a schematic sectional view illustrating another embodiment of a sheet material.

FIG. 2 is a schematic sectional view illustrating another embodiment of a sheet material. As illustrated in FIG. 2, in a sheet material 1 according to the present embodiment, a main surface 6b, on the opposite side to first electroless plating films 5, of a second electroless plating film 6 may be a rough surface 6s. Accordingly, visibility of the sheet material 1 can be further improved.

The sheet material 1 according to the present embodiment can be manufactured by the following method, for example. That is, a method for manufacturing the sheet material 1 according to the present embodiment includes a step (first step) of forming a resin layer 4 containing a binder 2 and a plurality of polypyrrole particles 3 on a transparent base material 8, at least some of the plurality of polypyrrole particles 3 respectively having exposure surfaces 3*a* exposed from one main surface 4*a* of the resin layer 4, the plurality of exposure surfaces 3*a* being scattered on the one main surface 4*a* of the resin layer 4, and the transparent base material 8 being provided on the side of the other main surface 4*b* of the resin layer 4, a step (second step) of making a solution containing a catalyst contact the exposure surfaces 3*a* of the polypyrrole particles 3 to form catalyst nuclei respectively adhering to the plurality of exposure surfaces 3*a*, a step (third step) of forming first electroless plating films 5 on the one main surface 4*a* of the resin layer 4 to respectively surround the plurality of exposure surfaces 3*a* and the catalyst nuclei, and a step (fourth step) of forming a second electroless plating film 6 to cover the first electroless plating films 5, a main surface 6*a*, on the side of the first electroless plating films 5, of the second electroless plating film 6 forming concave portions 6*r*, respectively, along surfaces of the first electroless plating films 5.

Examples of the method for forming the resin layer 4 on the transparent base material 8 in the first step include a method for preparing a resin composition containing a binder and polypyrrole particles and applying the obtained resin composition onto a transparent base material, followed by drying. Through the first step, a stacked body (first stacked body), including a transparent base material and a resin layer containing a binder and a plurality of polypyrrole particles on the transparent base material, in which at least some of the plurality of polypyrrole particles respectively have exposure surfaces exposed from one main surface of the resin layer and the plurality of exposure surfaces are scattered on the one main surface of the resin layer can be obtained. Although a mass ratio of the binder and the polypyrrole particles in the resin composition is not particularly limited, it is preferable that a mass ratio of the binder to the polypyrrole particles be 2:1 to 15:1, for example, from the viewpoint of more effectively suppressing a reflectance.

Examples of the method for forming the catalyst nuclei in the second step include a method for immersing the first stacked body obtained in the first step in a solution containing a catalyst, followed by rinsing or the like. Accordingly, catalyst nuclei can be specifically adsorbed onto the exposure surfaces of the polypyrrole particles. Through the second step, a stacked body (second stacked body) in which the catalyst nuclei respectively adhering to the plurality of exposure surfaces in the first stacked body are formed can be obtained.

Examples of the method for forming the first electroless plating films in the third step include a method for immersing the second stacked body obtained in the second step in a first electroless plating bath containing a predetermined metal, followed by rinsing or the like. Although a processing condition of the first electroless plating bath is not particularly limited, when a first electroless plating bath containing 0.1 to 2.0 grams of a predetermined metal per liter is used, for example, a processing temperature is 70 to 90° C., and a processing time period is 10 to 120 seconds. Through the third step, a stacked body (third stacked body) in which first electroless plating films are formed on the one main surface of the resin layer to respectively surround the plurality of exposure surfaces and the catalyst nuclei in the second stacked body can be obtained.

Examples of the method for forming the second electroless plating film 6 in the fourth step include a method for immersing the third stacked body obtained in the third step in a second electroless plating bath containing a predetermined metal, followed by rinsing or the like. Although a processing condition of the second electroless plating bath is not particularly limited, when a second electroless plating bath containing 1 to 5 grams of a predetermined metal per liter is used, for example, a processing temperature is 25 to 50° C., and a processing time period is 5 to 60 minutes. Through the fourth step, a sheet material in which a second electroless plating film is formed can be formed to cover the first electroless plating films in the third stacked body and for a main surface, on the side of the first electroless plating films, of the second electroless plating film to form concave portions, respectively, along the surfaces of the first electroless plating films.

A method for manufacturing the sheet material according to the present embodiment may further include a step of roughing the main surface, on the opposite side to the first electroless plating films, of the second electroless plating film after the above-described fourth step. In the roughing, a rough surface may be formed by roughing processing or may be formed by plating processing, for example.

[First Metal Mesh]

A first metal mesh according to the present embodiment includes a resin layer containing a binder and a plurality of polypyrrole particles, an electroless plating film provided to form a mesh-shaped pattern on the side of one main surface of the resin layer and including first electroless plating films and a second electroless plating film, and a transparent base material provided on the side of the other main surface of the resin layer. At least some of the plurality of polypyrrole particles respectively have exposure surfaces exposed from the one main surface of the resin layer, the plurality of exposure surfaces are scattered on the one main surface of the resin layer, the first electroless plating films are provided on the one main surface of the resin layer to respectively surround the exposure surfaces of the plurality of polypyrrole particles, the second electroless plating film is provided to cover the first electroless plating films, and a main surface, on the side of the first electroless plating films, of the second electroless plating film forms concave portions, respectively, along surfaces of the first electroless plating films.

The first metal mesh can be manufactured by performing etching for the electroless plating film in the above-described sheet material according to the present embodiment, to form an electroless plating film having the mesh-shaped pattern, for example.

Figure 3A:
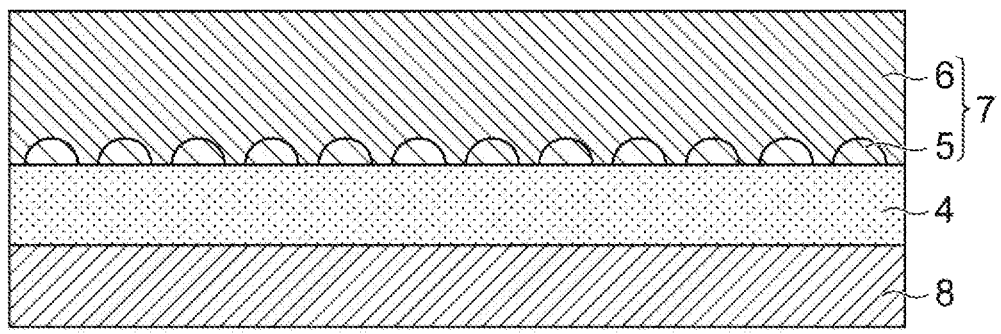
FIGS. 3A, 3B, and 3C are schematic views illustrating an embodiment of steps of manufacturing a metal mesh.
Figure 3B:
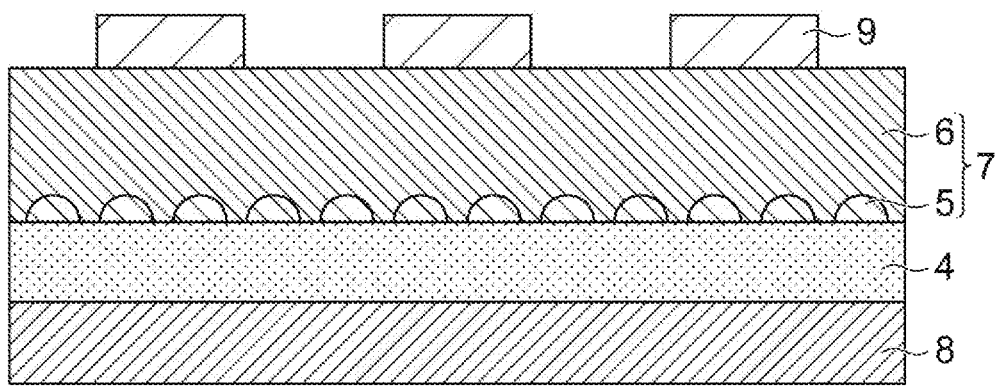
Figure 3C:
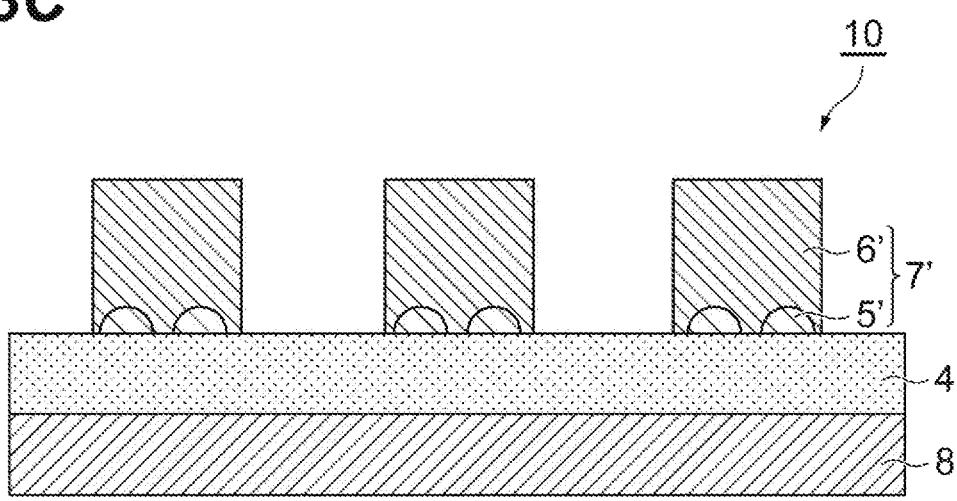

FIGS. 3A, 3B, and 3C are schematic views illustrating an embodiment of steps of manufacturing a first metal mesh 10. As illustrated in FIGS. 3A-3C, a sheet material 1 according to the present embodiment is first prepared (FIG. 3A), and a mesh-shaped resist pattern 9 is formed on a main surface, on the opposite side to a resin layer 4, of an electroless plating film 7 in the sheet material 1 (FIG. 3B). Although a method for forming the mesh-shaped resist pattern 9 is not particularly limited but a known method can be adopted, as needed, examples of the method include a method for forming a mesh-shaped resist pattern using a printing method, an ink jet method, a photolithography method, or the like and a method for forming a resist film, and then subjecting the resist film to pattern exposure and development to pattern the resist film into a mesh shape. Then, the electroless plating film 7 is etched using the resist pattern 9 as a mask, to form an electroless plating film 7' having a mesh-shaped pattern, and the resist pattern 9 is removed (FIG. 3C). Accordingly, the electroless plating film 7', including first electroless plating films 5' and a second electroless plating film 6', having a mesh-shaped pattern can be formed.

[Second Metal Mesh]

A second metal mesh according to the present embodiment includes a transparent base material, a resin layer provided to form a mesh-shaped pattern on the transparent base material and containing a binder and a plurality of polypyrrole particles, and an electroless plating film provided on the transparent base material along the mesh-shaped pattern of the resin layer while covering the resin layer and including first electroless plating films and a second electroless plating film. At least some of the plurality of polypyrrole particles respectively have exposure surfaces exposed from a surface of the resin layer, the plurality of exposure surfaces are scattered on the surface of the resin layer, the first electroless plating films are provided on the surface of the resin layer to respectively surround the plurality of exposure surfaces of the polypyrrole particles, the second electroless plating film is provided to cover the first electroless plating films, and a main surface, on the side of the first electroless plating films, of the second electroless plating film forms concave portions, respectively, along surfaces of the first electroless plating films.

The second metal mesh can be manufactured by the following method, for example.

Figure 4A:
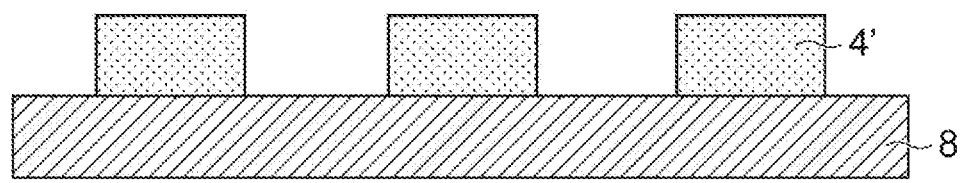
FIGS. 4A and 4B are schematic views illustrating another embodiment of steps of manufacturing a metal mesh.
Figure 4B:
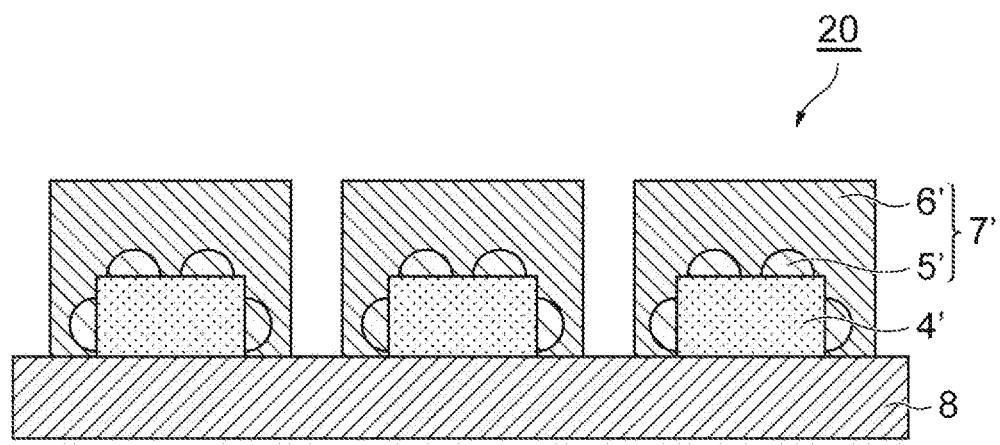

FIGS. 4A and 4B are schematic views illustrating an embodiment of steps of manufacturing a second metal mesh 20. As illustrated in FIGS. 4A and 4B, a resin layer 4' having a mesh-shaped pattern is first formed on a transparent base material 8 (FIG. 4A). Although a method for forming the resin layer 4' having the mesh-shaped pattern is not particularly limited but a known method can be adopted, as needed, examples of the method include a method for forming the resin layer 4' having the mesh-shaped pattern using a printing method, an ink jet method, a photolithography method, or the like.

Then, a solution containing a catalyst is made to contact exposure surfaces of a plurality of polypyrrole particles scattered on a surface of the resin layer 4' to form catalyst nuclei respectively adhering to the plurality of exposure surfaces. Then, first electroless plating films 5' are formed on the surface of the resin layer 4' to respectively surround the plurality of exposure surfaces and the catalyst nuclei. As a method for forming the catalyst nuclei and the first electroless plating films 5', a similar method to the method described in the above-described method for manufacturing the sheet material can be adopted.

When a second electroless plating film 6' is then formed on the transparent base material 8 to cover the resin layer 4' and the first electroless plating films 5', a second metal mesh can be formed (FIG. 4B). In the case, a main surface, on the side of the first electroless plating films 5', of the second electroless plating film 6' forms concave portions, respectively, along surfaces of the first electroless plating films 5'. As a method for forming the second electroless plating film 6', a similar method to the method described in the above-described method for manufacturing the sheet material can be adopted.

The sheet material and the metal mesh according to the present embodiment, described above, can be favorably used for a touch panel sensor of a smartphone, a tablet terminal, a PC (personal computer), or the like because a reflectance can be suppressed while an adhesive property between the base material and the plating film is high. The reflectance in the sheet material and the metal mesh which can be favorably used for the touch panel sensor is 20% or less, for example, preferably 15% or less, and more preferably 10% or less.

The sheet material according to the present embodiment can be used to manufacture a wiring substrate through a step of performing etching for the electroless plating film, as needed, to form an electroless plating film having a wiring pattern. A display device can also be obtained by further mounting an electronic component such as a light emitting element or a passive component, as needed, on the wiring substrate.

EXAMPLES

Although the present invention will be specifically described below by giving examples and comparative examples, the present invention is not limited to the following examples.

[Production of Sheet Material]

Example 1

1.5 mmol of an anionic surfactant PELEX OT-P (trade name manufactured by Kao Corporation), 50 ml of toluene, and 100 ml of ion-exchange water were added together, and are agitated while being kept at a temperature of 20° C., to obtain an emulsified liquid. 21.2 mmol of a pyrrol monomer was added to the obtained emulsified liquid, followed by agitation for one hour, and 6 mmol of ammonium persulfate was added thereto, followed by polymerization reaction for two hours. After the reaction ended, an organic layer was recovered, and was washed several times with the ion-exchange water, to obtain polypyrrole particles having an average particle diameter of 40 nm dispersed in the toluene.

5 parts by mass of SUPER BECKAMINE J-820 (trade name, manufactured by DIC Corporation) was added as a binder to 1 part by mass of the obtained polypyrrole particles, to produce a resin composition (a mass ratio of the binder to the polypyrrole particles was 5:1). The obtained resin composition was applied onto a PET film (trade name "COSMOSHINE A4100" manufactured by TOYOBO CO., LTD.), followed by drying, to obtain a first stacked body including a resin layer having polypyrrole particles exposed to its surface in a thickness of 60 μm on the PET film.

Then, the first stacked body was immersed in a solution containing 1 gram of palladium ions per liter, followed by rinsing, and the first stacked body was further immersed in a solution containing 10 grams of a hypophosphorous acid per liter, followed by rinsing, to obtain a second stacked body having catalyst nuclei respectively adsorbed onto exposure surfaces of the polypyrrole particles formed therein. The second stacked body was immersed in an electroless plating bath containing 0.5 grams of nickel ions per liter, and electroless plating processing was performed for 20 seconds with the plating bath set to a temperature of 82° C., to obtain a third stacked body having first electroless plating films each having an uneven surface formed therein. Then, the third stacked body was immersed in an electroless plating bath containing 3 grams of copper ions per liter, and electroless plating processing was performed for 45 minutes with the plating bath set to a temperature of 38° C., to produce a sheet material in which a second electroless plating film was formed on the respective uneven surfaces of the first electroless plating films. The thickness of the second electroless plating film was 1 μm, and concave portions, respectively, along the surfaces of the first electroless plating films were formed.

Example 2

A similar operation to that in the example 1 was performed except that a time period during which the first stacked body was immersed in the electroless plating bath containing nickel ions was set to 30 seconds, to obtain a sheet material.

Example 3

A similar operation to that in the example 1 was performed except that a time period during which the first stacked body was immersed in the electroless plating bath containing nickel ions was set to 40 seconds, to obtain a sheet material.

Example 4

A similar operation to that in the example 1 was performed except that a time period during which the first stacked body was immersed in the electroless plating bath containing nickel ions was set to 50 seconds, to obtain a sheet material.

Example 5

A similar operation to that in the example 1 was performed except that a time period during which the first stacked body was immersed in the electroless plating bath containing nickel ions was set to 60 seconds, to obtain a sheet material.

Example 6

A similar operation to that in the example 1 was performed except that a time period during which the first stacked body was immersed in the electroless plating bath containing nickel ions was set to 90 seconds, to obtain a sheet material.

Example 7

A similar operation to that in the example 1 was performed except that a time period during which the first stacked body was immersed in the electroless plating bath containing nickel ions was set to 120 seconds, to obtain a sheet material.

Comparative Example 1

Palladium was film-formed to have a thickness of 20 nm using a sputtering method on a PET film (trade name "COSMOSHINE A4100" manufactured by TOYOBO CO., LTD.), to obtain a stacked body. Then, the obtained stacked body was immersed in an electroless plating bath containing 0.5 grams of nickel ions per liter, and electroless plating processing was performed for 20 seconds with the plating bath set to a temperature of 82° C., to obtain a third stacked body having first electroless plating films each having a smooth surface formed therein. Then, the third stacked body was immersed in a solution containing 0.1 grams of palladium ions per liter, followed by rinsing, and was then immersed in an electroless plating bath containing 3 grams of copper ions per liter, and electroless plating processing was performed for 45 minutes with the plating bath set to a temperature of 38° C., to obtain a sheet material in which a second electroless plating film containing copper was formed on the respective surfaces of the first electroless plating films containing nickel. The thickness of the second electroless plating film containing copper was 1 µm.

Comparative Example 2

Nickel was film-formed to have a thickness of 20 nm using a sputtering method on a PET film (trade name "COSMOSHINE A4100" manufactured by TOYOBO CO., LTD.), to obtain a third stacked body having films each having a smooth surface formed therein. Then, the third stacked body was immersed in a solution containing 0.1 grams of palladium ions per liter, followed by rinsing, and was then immersed in a solution containing 10 grams of a hypophosphorous acid per liter, followed by rinsing. Then, the third stacked body was immersed in an electroless plating bath containing 3 grams of copper ions per liter, and electroless plating processing was performed for 45 minutes with the plating bath set to a temperature of 38° C., to obtain a sheet material in which the second electroless plating film containing copper was formed on the respective surfaces of the films containing nickel. The thickness of the electroless plating film was 1 µm.

Comparative Example 3

A PET film (trade name "COSMOSHINE A4100" manufactured by TOYOBO CO., LTD.) was immersed in a colloidal Sn—Pd solution for five minutes at a temperature of 25° C., followed by rinsing, and was then immersed in an electroless plating bath containing 0.5 grams of nickel ions per liter, and electroless plating processing was performed for 20 seconds with the plating bath set to a temperature of 82° C., to obtain a third stacked body having first electroless plating films each having an uneven surface formed therein. Then, the third stacked body was immersed in a solution containing 0.1 grams of palladium ions per liter, followed by rinsing, and was then immersed in an electroless plating bath containing 3 grams of copper ions per liter, and electroless plating processing was performed for 45 minutes with the plating bath set to a temperature of 38° C., to obtain a sheet material in which a second electroless plating film containing copper was formed on the respective uneven surfaces of the films containing nickel.

[Evaluation of Sheet Material]
(Measurement of Respective Longest Diameters and Area Ratio of First Electroless Plating Films)

The respective longest diameters and an area ratio of the first electroless plating films in each of the third stacked bodies obtained in the above-described examples and comparative examples were measured using image analysis of an SEM picture. The measurement was performed by observing each of the third stacked bodies at a magnification of 200000 times in a field of view which is 500 µm in length and 60 µm in width, to calculate an average value of the respective longest diameters of the first electroless plating films and the area ratio of the first electroless plating films to the field of view. Note that the respective surface of the films in the third stacked body produced in each of the comparative examples 1 and 2 was smooth, and thus the longest diameters thereof could not be measured. A measurement result is shown in Table 1.

(Measurement of Reflectance)

A reflectance of light from the side of the PET film in the sheet material obtained in each of the examples and the comparative examples was measured according to a method conforming to JIS K 8729 using Spectrophotometer CM-5

(product name, manufactured by KONICA MINOLTA, INC.). A measurement result is shown in Table 1. If the reflectance is 20% or less, the sheet material can be said to be a good sheet material in which a reflectance is kept low.
[Production of Metal Mesh]

A mesh-shaped resist pattern having 5 μm lines (L) and 10 μm spaces (S) was formed by photography on the electroless plating film in the sheet material obtained in each of the examples and the comparative examples. Then, the resist pattern was immersed in a 5% sodium persulfate solution, and was etched for five minutes at a temperature of 25° C., to remove a resist, thereby producing a metal mesh.
[Evaluation of Metal Mesh]
(Evaluation of Adhesive Property)

The obtained metal mesh was wound around a stainless steel rod having a diameter of 1 mm, to evaluate an adhesive property of the electroless plating film according to the following evaluation criteria. The result is shown in Table 1.

A: Peeling of the plating film was not recognized even after the metal mesh was wounded 500 times.

B: Peeling of the plating film was recognized by winding the metal mesh less than 500 times.
(Evaluation of Etching Property)

The presence or absence of disconnection of a line by etching was visually observed, and an etching property was evaluated according to the following evaluation criteria. The result is shown in Table 1.

A: Disconnection of the line was not recognized when etching was performed.

B: Disconnection of the line was recognized when etching was performed.

erty could not be ensured. The plating film formed in a portion to which the palladium particles did not adhere formed a continuous film having a smooth surface, whereby the reflectance could not be kept low.

What is claimed is:

1. A sheet material comprising an electroless plating layer and a transparent base material with a resin layer interposed therebetween in a stacked relationship:
    the resin layer comprising a binder and a plurality of polypyrrole particles; the electroless plating layer comprising a plurality of first electroless plating films and a second electroless plating film, wherein
    at least some of the plurality of polypyrrole particles respectively have exposure surfaces exposed from a surface of the resin layer on which the electroless plating layer is stacked, and the plurality of exposure surfaces are scattered on said surface of the resin layer,
    the plurality of first electroless plating films are provided on said surface of the resin layer to respectively surround the plurality of exposure surfaces of the polypyrrole particles,
    the second electroless plating film is provided to cover the first electroless plating films, and forms concave portions, respectively, along surfaces of the first electroless plating films, and
    the first electroless plating films and the second electroless plating film, respectively, contain metals or metal compounds different from each other.

2. The sheet material according to claim 1, wherein an average value of respective longest diameters of the first electroless plating films is 18 to 90 nm when the surface of

TABLE 1

|  | Example 1 | Example 2 | Example 3 | Example 4 | Example 5 | Example 6 | Example 7 | Comparative example 1 | Comparative example 2 | Comparative example 3 |
|---|---|---|---|---|---|---|---|---|---|---|
| Average value of longest diameters (nm) | 18 | 20 | 25 | 30 | 35 | 60 | 90 | Smooth | Smooth | 120 |
| Area ratio (%) | 85.0 | 90.0 | 95.0 | 96.0 | 98.0 | 99.0 | 99.0 | 100 | 100 | 50-80 |
| Reflectance (%) | 18.0 | 9.5 | 3.7 | 6.7 | 9.7 | 12.3 | 13.3 | 31.0 | 25.0 | 23.0 |
| Adhesive property | A | A | A | A | A | A | A | A | A | B |
| Etching property | A | A | A | A | A | A | A | B | A | A |

As can be seen from respective results of the examples 1 to 7, in the sheet material according to the present invention, the reflectance could be kept low while the adhesive property between the base material and the plating film could be enhanced. Further, the disconnection of the line was not recognized when etching was performed, thereby indicating that the sheet material had an excellent etching property.

On the other hand, in the comparative example 1 in which the palladium film was provided on the PET film using the sputtering method, and the nickel plating films were then formed and the comparative example 2 in which the nickel films were directly formed on the PET film using the sputtering method, almost all of the films containing nickel formed a continuous film having a smooth surface, whereby the reflectance could not be kept low. Further, when the films were provided, like in the comparative example 1, the copper plating film was preferentially etched, thereby indicating that the line was easily disconnected. In the comparative example 3 in which the PET film was immersed in the colloidal Sn—Pd solution to make the palladium particles adhere to the PET film and then form the nickel plating films, the plating films were formed without using a resin layer. Accordingly, the palladium particles did not sufficiently adhere to the PET film, whereby the adhesive propthe resin layer on which the electroless plating layer is stacked is viewed in a planar view from the side of the electroless plating layer.

3. The sheet material according to claim 1, wherein an area ratio of the first electroless plating films to the surface of the resin layer on which the electroless plating layer is stacked is 80 to 99% when said surface is viewed in a planar view from the side of the electroless plating layer.

4. The sheet material according to claim 1, wherein the electroless plating layer has a surface, on the opposite side of the surface of the resin layer on which the electroless plating layer is stacked, wherein said surface on the opposite side is a rough surface.

5. A method for manufacturing the sheet material according to claim 1, comprising:
    a step of forming a resin layer comprising a binder and a plurality of polypyrrole particles on a transparent base material, at least some of the plurality of polypyrrole particles respectively having exposure surfaces exposed from one main surface of the resin layer, the plurality of exposure surfaces being scattered on the one main surface of the resin layer, and the transparent base material being provided on the side of the other main surface of the resin layer;

a step of making a solution comprising a catalyst contact the exposure surfaces of the polypyrrole particles, to form catalyst nuclei respectively adhering to the plurality of exposure surfaces;

a step of forming first electroless plating films on the one main surface of the resin layer to respectively surround the plurality of exposure surfaces and the catalyst nuclei; and a step of forming a second electroless plating film to cover the first electroless plating films, a main surface, on the side of the first electroless plating films, of the second electroless plating film forming concave portions, respectively, along surfaces of the first electroless plating films.

6. A method for manufacturing a metal mesh, comprising a step of performing etching for the electroless plating film in the sheet material according to claim 1 to form an electroless plating film having a mesh-shaped pattern.

7. A metal mesh comprising an electroless plating layer and a transparent base material with a resin layer interposed therebetween in a stacked relationship:

the resin layer comprising a binder and a plurality of polypyrrole particles; an electroless plating layer provided to form a mesh-shaped pattern on a surface of the resin layer on which the electroless plating layer is stacked, the electroless plating layer comprising first electroless plating films and a second electroless plating film, wherein at least some of the plurality of polypyrrole particles respectively have exposure surfaces exposed from a said surface of the resin layer, and the plurality of exposure surfaces are scattered on said surface of the resin layer, the plurality of first electroless plating films are provided on said surface of the resin layer to respectively surround the plurality of exposure surfaces of the polypyrrole particles, the second electroless plating film is provided to cover the first electroless plating films, and forms concave portions, respectively, along surfaces of the first electroless plating films, and the first electroless plating films and the second electroless plating film, respectively, contain metals or metal compounds different from each other.

8. A metal mesh comprising:

a transparent base material; a resin layer provided to form a mesh-shaped pattern on the transparent base material and comprising a binder and a plurality of polypyrrole particles; and an electroless plating layer provided on the transparent base material along the mesh-shaped pattern of the resin layer while covering the resin layer and comprising a plurality of first electroless plating films and a second electroless plating film, wherein at least some of the plurality of polypyrrole particles respectively have exposure surfaces exposed from a surface of the resin layer, and the plurality of exposure surfaces are scattered on the surface of the resin layer, the plurality of first electroless plating films are provided on the surface of the resin layer to respectively surround the plurality of exposure surfaces of the polypyrrole particles, and the second electroless plating film is provided to cover the first electroless plating films, and a surface, on the side of the first electroless plating films, of the second electroless plating film forms concave portions, respectively, along surfaces of each of the first electroless plating films, and the first electroless plating films and the second electroless plating film, respectively, contain metals or metal compounds different from each other.

9. The metal mesh according to claim 7, wherein a surface, on the opposite side of the electroless plating layer is a rough surface.

10. The sheet material according to claim 1, wherein the exposed surfaces of the polypyrrole particles contain catalyst nuclei adsorbed thereon.

11. The sheet material according to claim 10, wherein the catalyst nuclei are at least one selected from the group consisting of palladium, silver, platinum, gold, nickel, copper, and compounds thereof.

12. The sheet material according to claim 11, wherein the catalyst nuclei include phosphorus.

13. The sheet material according to claim 1, wherein the first electroless plating films contain at least one metal selected from a group consisting of nickel, palladium, gold, silver, and compounds thereof.

14. The sheet material according to claim 1, wherein second electroless plating film contains at least one metal selected from a group consisting of copper, nickel, silver, and compounds thereof.

15. The sheet material according to claim 1, wherein the first electroless plating films contain nickel or a nickel compound and the second electroless plating film contains copper.

* * * * *